US010645814B2

(12) United States Patent
Bisges et al.

(10) Patent No.: US 10,645,814 B2
(45) Date of Patent: May 5, 2020

(54) METHOD FOR CREATING PATTERNED COATINGS ON A MOLDED ARTICLE, AND DEVICE FOR CARRYING OUT SAID METHOD

(71) Applicants: PLASMA INNOVATIONS GMBH, Attnang-Puchheim (AT); LPKF LASER & ELECTRONICS AG, Garbsen (DE)

(72) Inventors: Michael Bisges, Regensburg (DE); Roman Ostholt, Langenhagen (DE); Bernd Rösener, Porta Westfalica (DE); Daniel Dunker, Hannover (DE)

(73) Assignees: PLASMA INNOVATIONS GMBH, Attnang-Puchheim (AT); LPKF LASER & ELECTRONICS AG, Garbsen (DE)

( * ) Notice: Subject to any disclaimer, the term of this patent is extended or adjusted under 35 U.S.C. 154(b) by 0 days.

(21) Appl. No.: 15/768,190

(22) PCT Filed: Sep. 30, 2016

(86) PCT No.: PCT/EP2016/073386
§ 371 (c)(1),
(2) Date: Apr. 13, 2018

(87) PCT Pub. No.: WO2017/063899
PCT Pub. Date: Apr. 20, 2017

(65) Prior Publication Data
US 2018/0332711 A1 Nov. 15, 2018

(30) Foreign Application Priority Data
Oct. 15, 2015 (DE) .......... 10 2015 117 558

(51) Int. Cl.
| H05K 3/10 | (2006.01) |
|---|---|
| H05K 3/14 | (2006.01) |
| H05K 3/18 | (2006.01) |
| C23C 24/10 | (2006.01) |
| H05K 3/02 | (2006.01) |

(52) U.S. Cl.
CPC ........... *H05K 3/102* (2013.01); *C23C 24/106* (2013.01); *H05K 3/14* (2013.01); *H05K 3/182* (2013.01);
(Continued)

(58) Field of Classification Search
CPC ... C23C 18/1868; C23C 18/22; C23C 24/106; C23C 24/10; C23C 4/02; C23C 4/134;
(Continued)

(56) References Cited

U.S. PATENT DOCUMENTS 2,893,150 A 7/1959 Tann
3,042,591 A 7/2000 Cado
(Continued)

FOREIGN PATENT DOCUMENTS

DE 19828987 A1 1/2000
DE 10110939 A1 9/2002
(Continued)

*Primary Examiner* — Michael P Wieczorek
(74) *Attorney, Agent, or Firm* — Lucas & Mercanti, LLP

(57) ABSTRACT

A method for creating patterned coatings on a molded article includes providing a molded article which has a surface comprising a first area and a second area, at least one surface property in the first area of the surface being different from that in the second area, applying a coating covering at least the first area and the second area to the surface of the molded article, the adhesion of said coating being greater in the first area than in the second area because of the at least one different surface property, and partially removing the coating by means of a removal process which is applied to the entire coating at a constant removal power that is determined such that the entire coating is removed in the second area (Continued)

while the coating remains in place on an entire surface of the first area.

5 Claims, 5 Drawing Sheets

(52) U.S. Cl.
CPC ......... *H05K 3/02* (2013.01); *H05K 2203/025* (2013.01); *H05K 2203/0522* (2013.01); *H05K 2203/081* (2013.01); *H05K 2203/088* (2013.01); *H05K 2203/095* (2013.01); *H05K 2203/107* (2013.01); *H05K 2203/1344* (2013.01)

(58) Field of Classification Search
CPC .. C23C 4/08; C23C 4/18; C23C 4/185; H05K 3/102; H05K 3/14; H05K 3/182; H05K 3/02
See application file for complete search history.

(56) References Cited

U.S. PATENT DOCUMENTS

| | | | |
|---|---|---|---|
| 6,500,758 B1 * | 12/2002 | Bowers | H01L 21/32131 257/E21.306 |
| 7,291,380 B2 * | 11/2007 | Nyholm | C23C 18/22 174/257 |
| 8,241,710 B2 | 8/2012 | Süss-Wolf et al. | |
| 8,987,632 B2 * | 3/2015 | Wohl, Jr. | B32B 38/10 219/121.69 |
| 9,826,634 B2 | 11/2017 | Yi et al. | |
| 2002/0170890 A1 * | 11/2002 | Keicher | B05B 7/228 219/121.64 |
| 2004/0055153 A1 | 3/2004 | Zahradnik et al. | |
| 2011/0233175 A1 | 9/2011 | Vermeer et al. | |
| 2014/0023856 A1 | 1/2014 | Bisges | |
| 2015/0031203 A1 * | 1/2015 | Krenzer | H01L 21/02068 438/669 |

FOREIGN PATENT DOCUMENTS

| | | |
|---|---|---|
| DE | 102006061435 A1 | 6/2008 |
| DE | 112012004940 T5 | 9/2014 |
| GB | 2089581 A | 6/1982 |
| GB | 2439934 A | 1/2008 |
| GB | 2451656 A | 2/2009 |
| JP | S57121294 A | 7/1982 |
| JP | 2006261629 A | 9/2006 |
| JP | 2014511941 A | 5/2014 |
| KR | 100301455 B1 | 6/2001 |
| WO | 2016173963 A1 | 11/2016 |

\* cited by examiner

METHOD FOR CREATING PATTERNED COATINGS ON A MOLDED ARTICLE, AND DEVICE FOR CARRYING OUT SAID METHOD

CROSS-REFERENCE TO RELATED APPLICATIONS

This application is a 371 of PCT/EP2016/073386 filed Sep. 30, 2016, which in turn claims the priority of DE 10 2015 117 558.4 filed Oct. 15, 2015, the priority of both applications is hereby claimed and both applications are incorporated herein by reference.

BACKGROUND OF THE INVENTION

The invention relates to a method for producing patterned coatings on a molding and to a device for implementing the method. The molding in question is in particular a planar or three-dimensional circuit carrier, composed of an insulating material, which is provided with a patterned metallic coating, more particularly a conductor track pattern. The invention further relates to a device for implementing the method.

In the case of subtractive methods for producing planar circuit carriers (printed circuit boards), the conductor track structure comes about through the partial removal of metallization which is applied beforehand to the circuit carrier. In the case of additive methods, the conductor track structure is applied by the controlled deposition of metallization on the circuit carrier.

Planar circuit carriers (printed circuit boards) usually consist of an electrically insulating material. A customary insulating material is fiber-reinforced plastic (FR4). The conductor track structures on printed circuit boards are produced photolithographically from a thin metallization layer, made in particular of copper, as follows:

A thin layer of light-sensitive photoresist is applied to the surface of the printed circuit board, which at this stage is fully metallized. Depending on the photoresist used, the exposure of the photoresist through a mask with the desired pattern leaves either the exposed or the unexposed portions of the photoresist soluble in a developer solution, and they are removed. If the printed circuit board thus treated is introduced into a suitable etching solution (e.g., an aqueous solution of iron(III) chloride or sodium persulfate), only the photoresist-free region of the metallized surface is removed by the etching solution; the regions covered by the photoresist are retained, since the photoresist is resistant to the etching solution.

These subtractive, wet-chemical methods are subject to restrictions from standpoints of environmental protection. Moreover, the subtractive, wet-chemical methods can be carried out virtually only with printed circuit boards made of FR4 material. Plastics are not among the materials contemplated, since the additives present in the plastics become unstable due to the wet-chemical process steps, and the additives in solution in the baths alter the properties of the metallization. A further factor is that circuit carriers which are not planar, but instead are three-dimensional, cannot be economically produced by subtractive, wet-chemical methods.

In the case of injection-molded three-dimensional circuit carriers (molded interconnect devices, MIDs), however, conductor track structures can nevertheless be produced on the surface of moldings made of plastic. The circuit carrier receives its three-dimensional form through the injection molding operation, and the conductor track structures are usually applied additively, by chemical or electrochemical means, to the surface. For the molding, essentially high-temperature thermoplastics and construction thermoplastics are employed. The long operating time for producing the injection-molded, three-dimensional circuit carriers, however, is less well suited to the economic mass production of three-dimensional circuit carriers.

A method is known from DE 11 2012 004 940 T5 for producing a conductor track structure on a substrate, with the following steps:
- forming a first metal layer on a nonconducting substrate;
- deliberately removing a part of the first metal layer by laser to expose the nonconducting substrate, so as to form the first metal layer as a coated region and a noncoated region, the coated region being divided into two sections forming conductor tracks, and at least one bridge section;
- forming a second metal layer on the coated region by electroplating only the coated region, using one of the sections forming the conductor tracks, and the bridge section, as electrode, and
- removing the bridge section and the second metal layer formed on the bridge section. The removing can be done by controlled laser depletion. With that, the method for producing the structured conductor track is concluded. The removal step, however, can also be carried out chemically, by immersing the structured substrate into a chemical bath. Since the sections forming conductor tracks are wider than the bridge sections disposed between them, the bridge sections and the second metal layer formed thereon can be removed effectively by adjusting the immersion time, without adverse consequences for the sections forming conductor tracks.

BRIEF SUMMARY OF THE INVENTION

On the basis of this prior art, the problem addressed by the invention is that of proposing a subtractive method for producing patterned coatings on a molding that is suitable for inexpensive, mass production of coated moldings, more particularly three-dimensional moldings. The aim in particular is to propose a subtractive method for inexpensive, mass production of three-dimensional circuit carriers made of plastic with metallic conductor track structures. The intention, finally, is to specify a device for implementing the method.

The difference in adherence of the coating in the at least one first region and in the at least one second region of the surface of the molding is utilized in accordance with the invention for the partial removal of the coating by means of the depletion method. During the operation of depletion, the depletion method is operated with a constant depletion rate which is determined in such a way that the coating in each second region is removed completely, because of the lower adherence there, whereas the coating in each first region is retained over its full area. Depending on the depletion method, however, the layer thickness of the coating can also be reduced by the depletion method in each first region, but without exposing the underlying first region of the surface of the molding.

The molding consists preferably of electrically insulating material, more particularly plastics, such as polycarbonate or polycarbonate-ABS.

The molding may have a planar or else an arbitrary geometrical three-dimensional form; it may be made up of flat or curved surface sections.

In order to generate a higher adherence of the coating in the first region relative to the second region on the surface of the molding, the surfaces of the first and second regions may differ in one or more of the following surface properties:

roughness and/or
hardness and/or
surface tension and/or
structure of material and/or
material.

The different surface properties of the molding may be achieved, on the one hand, by controlled surface treatment in the first and/or second region or by regionally differing materials. An example of a surface treatment contemplated is plasma activation or a laser treatment. Different materials on the surface of the molding may be brought about, for example, by operations of partial coating, of printing, by multicomponent injection molding, or by the laminating of different materials.

In order reliably to remove the coating completely by the depletion method with a defined, constant depletion rate in the second region, the adherence of the coating in the first region is higher by at least 5%, but preferably by at least 50%, than in the second region. By altering the structure of material of a plastics molding it is possible to attain adherences in the patterned first region of 200-500 N/cm² and in the second regions of less than 10 N/cm².

The adherence of the coating in the first and second regions is determined preferably using the frontal pull-off test according to DIN EN ISO 4624:2003. The frontal pull-off test serves for determining the adherence by the pulling-off of a single-layer coating or of a multicoat system, by measuring the minimum tensile stress needed in order to part or pull off the coating perpendicularly from the surface of the molding. The test result within the frontal pull-off test is influenced not only by the mechanical properties of the system under test, but also by the nature and preparation of the molding surface, by the method for applying the coating, and by other factors in the surroundings. Accordingly, the frontal pull-off test is particularly suitable for measuring the adherence in the present method.

Coating material used comprises preferably electrically conductive materials, more particularly metal powders, especially those of copper or of mixtures of copper and tin. The coating is applied with a layer thickness in the range from 1 μm to 500 μm, preferably in the 5-50 μm range, to the surface of the molding. The applied coating preferably has a porosity of at least 3%. The porosity is the ratio of the void volume of the applied coating to the total volume of the coating. The total volume is made up of the void volume and the pure solids volume:

$$\Phi = \frac{V_H}{V} = \frac{V_H}{V_H + V_F}$$

where
Φ porosity
$V_H$ void volume
$V_F$ pure solids volume
V total volume

The coating is applied to the surface of the molding preferably in one of the following coating methods:
1. Laser coating method comprising the following steps:
   providing a gas mixture stream comprising a carrier gas and a coating material,
   supplying the gas mixture stream to the surface, with the gas mixture stream impinging on the surface, and the coating material applied there forming an impingement region on the surface,
   coupling at least one laser beam into the gas mixture stream, with each laser beam being oriented onto the gas mixture stream in such a way that the laser beam does not strike the impingement region on the surface.
   This method is distinguished by the melting of the coating material while still in the gas mixture stream, in tandem with a low thermal load on the surface of the molding.
2. A plasma coating method enables automated deposition of coating materials, especially metallic coating materials, from a cold-active atmospheric pressure plasma directly onto the surface of the molding. The gas plasma is generated by a gas discharge. The coating material is supplied continuously under ambient conditions to these cold, nonthermal plasmas with temperatures of between 120 and 250 degrees Celsius. The particle diameter of the coating material is preferably 100 nm to 20 μm. With the plasma coating method, homogeneous coatings with reproducible layer thicknesses can be generated in operating speeds of up to 150 m/min. The plasma coating method is therefore particularly suitable for the inexpensive mass production of patterned coatings. The metallic coatings, especially the conductor track structures, can be applied with a thickness of between 1 and 1000 μm.
3. An aerosol jet method is suitable for the deposition of coatings having ultrafine structures in the region well below 50 μm. With the aerosol jet method, the coating material takes the form of a liquid material in an atomizer, where the aerosol for application is generated pneumatically or by ultrasound. This aerosol is transported to an applicator head with a nozzle. Via the nozzle, the aerosol is applied to the surface of the molding.
4. In the case of an immersion coating method, the molding, or at least the surface thereof that is to be coated, is immersed into a coating solution and then withdrawn again. During the withdrawal, a thin film of liquid remains on the surface. Alternatively, the surface of the molding is coated not by being immersed into the coating solution, but instead by means of a special-purpose printer. This printer sprays the surface of the molding with the coating solution. The above-stated methods are members of the chemical solution deposition methods, in which a surface is first wetted with a solution, and then this layer is solidified. These deposition methods can be carried out under ambient conditions and consequently, unlike the methods of chemical or physical vapor deposition, do not require reduced pressure. They can therefore be carried out more rapidly and more cost-effectively. With the chemical solution deposition methods, moreover, even large surface areas can be given defect-free coatings. The methods of chemical solution deposition are therefore particularly suitable for the mass, inexpensive production of patterned coatings on a molding.

The coating of at least one first region and one second region of the surface of the molding is followed by the partial removal of the coating by means of a subtractive depletion method, with particularly suitable depletion methods being those elucidated below:
1. In the case of $CO_2$ snow jetting, the surface is depleted with a jetting agent, namely solid carbon dioxide. The depletion rate during $CO_2$ snow jetting can be fine-tuned via numerous influencing parameters, particularly the mass flow rate of the jetting agent, the jetting pressure, the volume flow rate of the compressed air, the relative velocity between the jet and the surface, the operating distance, the jet impingement angle, and the particle velocity of the jetting agent. In the case of $CO_2$ snow jetting, the depletion of the coating is based on a mechanical effect, a thermal effect, and a sublimation effect. The mechanical effect is based on the high velocity with which the solid carbon dioxide particles strike. The thermal effect is based on the sudden cooling of the coating as a result of the impinging jet, evoking thermal stress between the coating and the surface of the molding. The sublimation effect is based on the increase in volume of the solid carbon dioxide as it undergoes transition to the gaseous state on striking the coating.

2. In the case of particle jetting, particles drive the coating material out of its bonded state. One typical method is that of sandblasting, with microsandblasting being particularly suitable for the invention. The effect of particle jetting, and particularly of microsandblasting, is that the coating in the first region, owing to the greater adherence, is not removed completely, as it is in the first region, and yet the thickness of the coating is likewise reduced.

3. A further possibility for removing the coating selectively only in each second region is that of adhering an adhesive film to the entire coating and then peeling it off. The adherence of the film applied to the top face of the coating is greater than the adherence of the coating to the surface of the molding in each second region, and less than the adherence of the coating on the surface of the molding in each first region. As a result of this, when the adhesive film is peeled off, the coating parts exclusively from the second regions, but not from the first regions of the surface of the molding. The advantage of this method is that the coating in the first regions is retained over its full area, in its full layer thickness.

4. Further methods for removing the coating are those of ultrasound cleaning, compressed air jetting, high-pressure water jetting, and washing.

A particularly advantageous method for mass, inexpensive production of three-dimensional circuit carriers of plastic with metallic conductor track structures is distinguished by an application of a coating that covers a first region and a second region on a surface of a molding, where an adherence of the coating in the first region is higher than in the second region, and a partial removal of the coating by a depletion method with a constant depletion rate so that the coating in the second region is removed completely and the coating in the first region is fully retained. Provided accordingly is a plastics molding where each first region of the surface is patterned by means of a laser in such a way that the adherences in the first regions are more than 100 N/cm2. The metallic coating is applied by means of a laser or plasma coating method in such a way that the applied coating has a porosity of at least 3%. The subsequent partial removal of the coating is accomplished via the CO2 snow jetting of the coated surface. Particularly in conjunction with the porous coating, the CO2 snow jetting leads to clean fracture edges along the boundaries of each first region.

BRIEF DESCRIPTION OF THE DRAWINGS

The invention is elucidated in more detail below by means of the figures, in which.

DETAILED DESCRIPTION OF THE PREFERRED EMBODIMENTS

Figure 1:
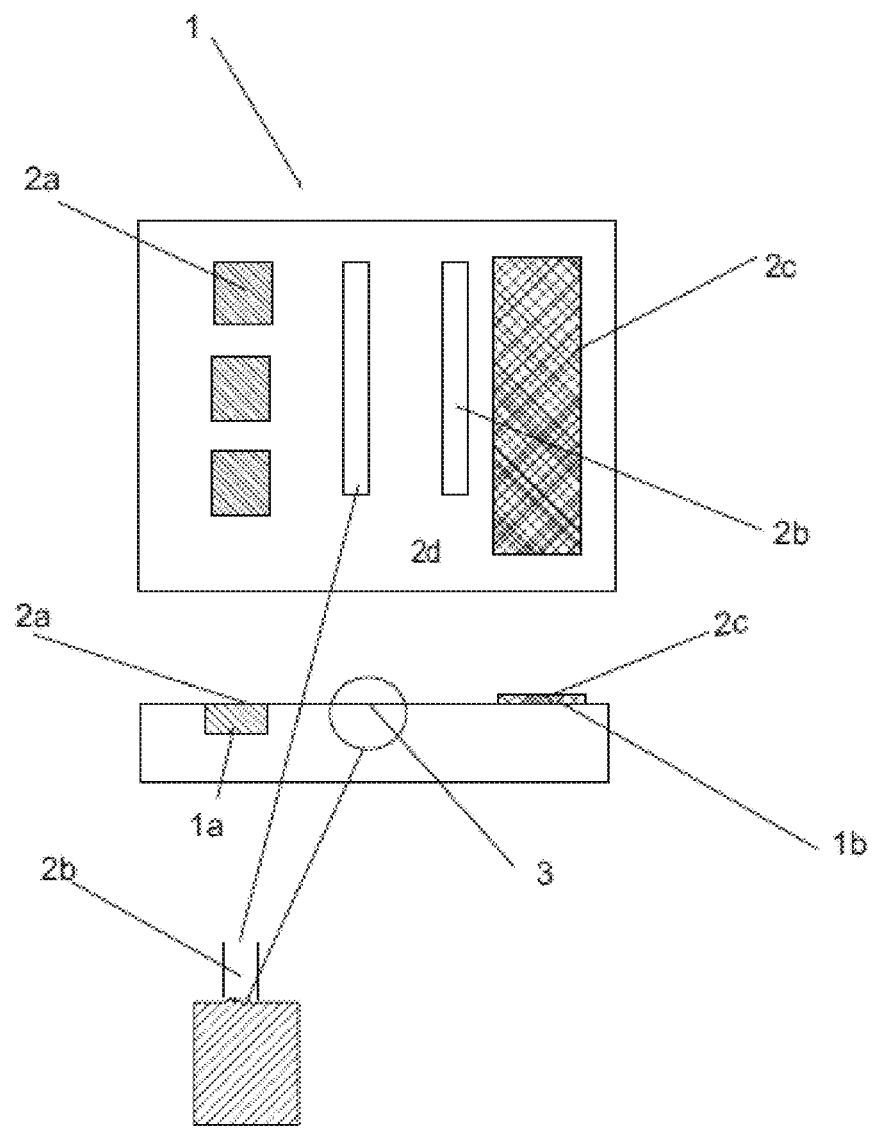
FIGS. 1-2 show diagrammatic representations illustrating the method steps for producing patterned coatings on a molding.

FIG. 1 illustrates the provision of a cuboidal molding (1) having a surface which on its top side comprises a plurality of first regions (2a, b, c) and a second region (2d). The surfaces of the first regions (2a, b, c) differ from the surface of the second region (2d) in their surface properties.

In order to generate the first regions (2a) on the surface of the molding (1), there are blocks (1a) let into the molding (1) that consist of a different material from the rest of the molding (1).

In order to generate the surfaces (2b), the surface of the molding (1) in the second regions (2b) is roughened, as is apparent from the detail view (3), and so a rougher surface is produced relative to the adjacent surface of the second region (2d).

The surface in the first region (2c) is generated by the fact that in the first region (2c) the molding (1) has a coating (1b) of a material which differs from the remaining material of the molding (1). The materials of the let-in blocks (1a) and of the coating (1b) for forming the first regions (2a and 2c, respectively), however, may match.

For the purpose of illustration, different possibilities have been shown in FIG. 1 for generating different surface properties in the first regions (2a, b, c) and second regions (2d). In the context of the mass production of patterned coatings on a molding (1), however, preference is given to utilizing exclusively one of the above-stated possibilities.

Because of the difference in surface properties, the adherence of a coating for application to the top side of the molding (1) is at least 50% higher in the first regions (2a, b, c) than in the second region (2d).

Figure 2:
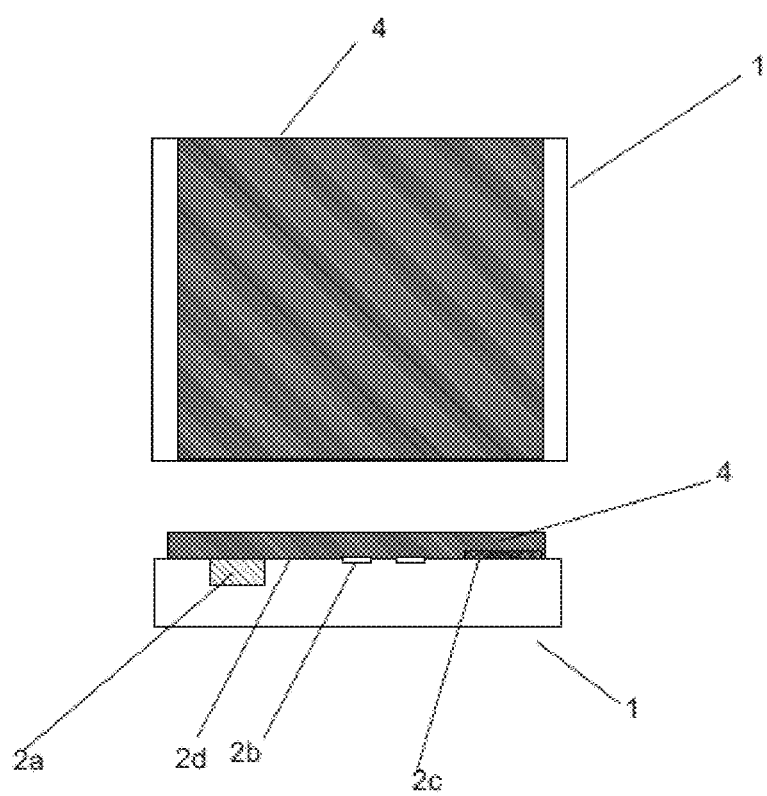

FIG. 2 illustrates the coating (4), which is applied over virtually the whole area of the top side of the molding and which, as can be seen from the side view, covers all the first regions (2a, b, c) and the second region (2d) on the top side of the molding.

The coating (4) is applied by a laser coating method, for example, to the surface of the molding (1), which is elucidated in more detail below with reference to FIG. 4.

Figure 3:
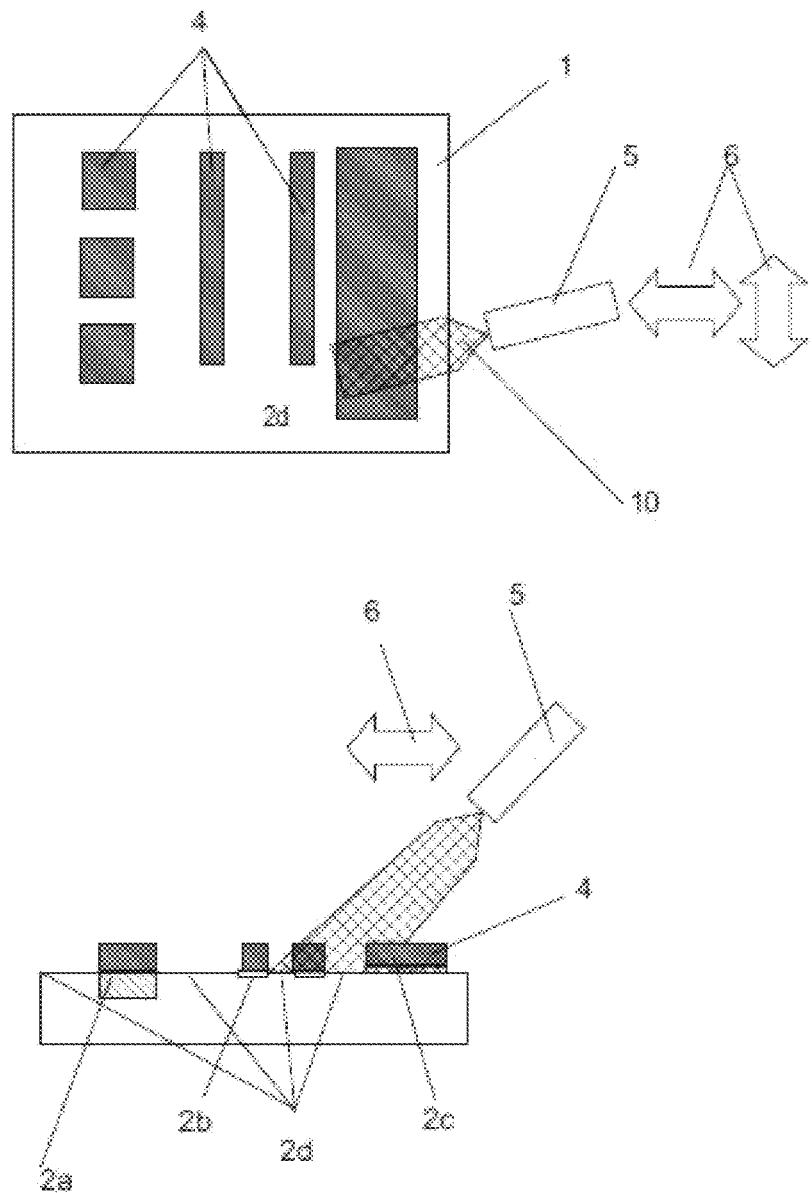
FIG. 3 shows a diagrammatic representation illustrating the partial depletion of the coating.

For the patterning of the coating (4) applied over virtually the whole area of the top side, this coating, as shown diagrammatically in FIG. 3, is partially removed again from the surface by means of a depletion method. In the exemplary embodiment shown, the partial removal of the coating (4) is accomplished by $CO_2$ snow jetting. A jetting nozzle (5) for the air jet with solid carbon dioxide is disposed, relative to the coated surface of the molding (1), movably in the direction of the arrows (6), on a handling means which is not shown. The parameters of the $CO_2$ snow jetting are selected such that in the second region (2d) the coating (4) is removed completely, whereas in all of the first regions (2a, b, c) it is retained over its full area.

Figure 4:
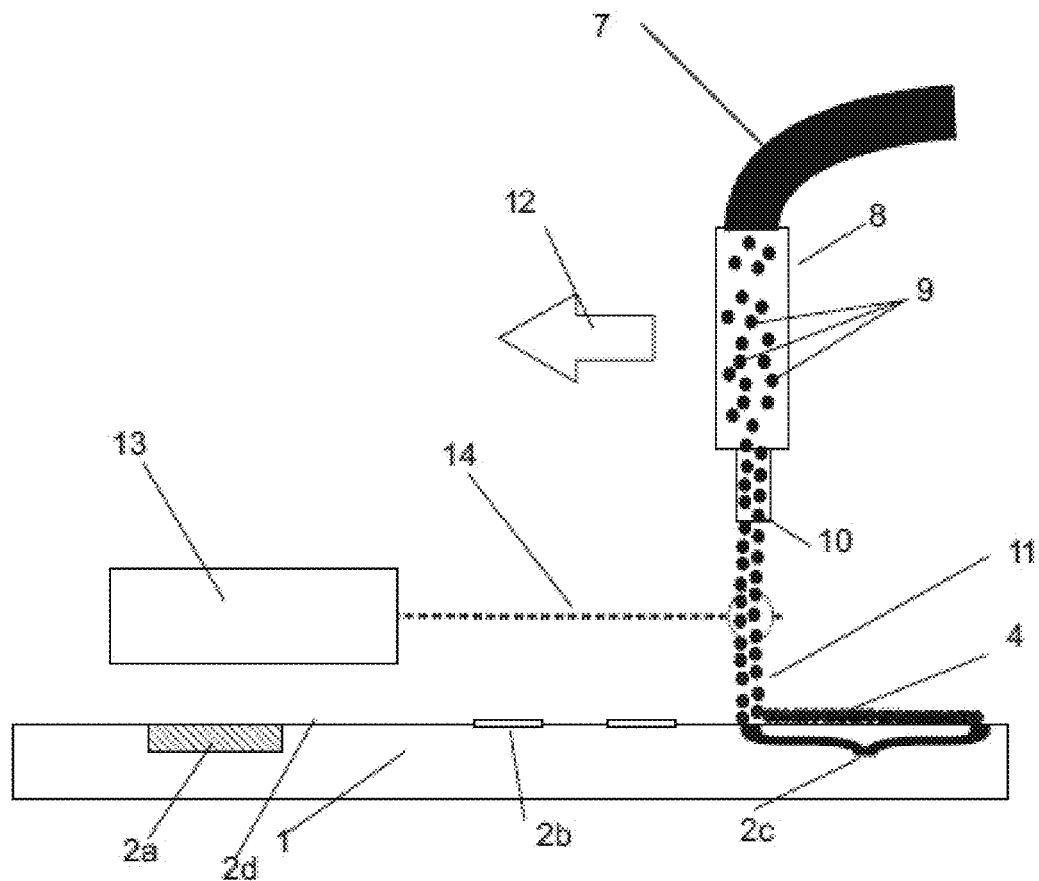
FIG. 4 shows a diagrammatic representation illustrating a laser coating method for applying a coating to the surface of a molding.

FIG. 4 illustrates the application of the coating (4) by laser coating. The application of the metallic coating material in powder form comprises the following steps:

A gas mixture stream is supplied via a line (7) to a powder nozzle (8), the gas mixture stream (11) comprising air as carrier gas and the metallic coating material (9). The outlet (10) of the powder nozzle (8) is directed at the molding (1)

surface to be coated, so that the gas mixture stream (11) strikes the surface of the molding (1), and the coating materials applied there by relative movement in the direction of the arrow (12) form the coating (4) on the surface. By means of a laser (13), a laser beam (14) is coupled into the gas mixture stream (11), and each laser beam (14) is aligned to the gas mixture stream (11) in such a way that the laser beam (14) does not strike the coating (4) on the surface. The laser beam (14) melts the coating material (9) in the gas mixture stream (11), causing this stream to enter into an adherent bond with the first regions (2a, b, c) and with the second region (2d) of the surface of the molding (1), without subjecting said surface to unnecessary thermal loading. Consequently, moldings (1) made of plastic, more particularly polycarbonate, can be coated with the laser coating method.

Figure 5:
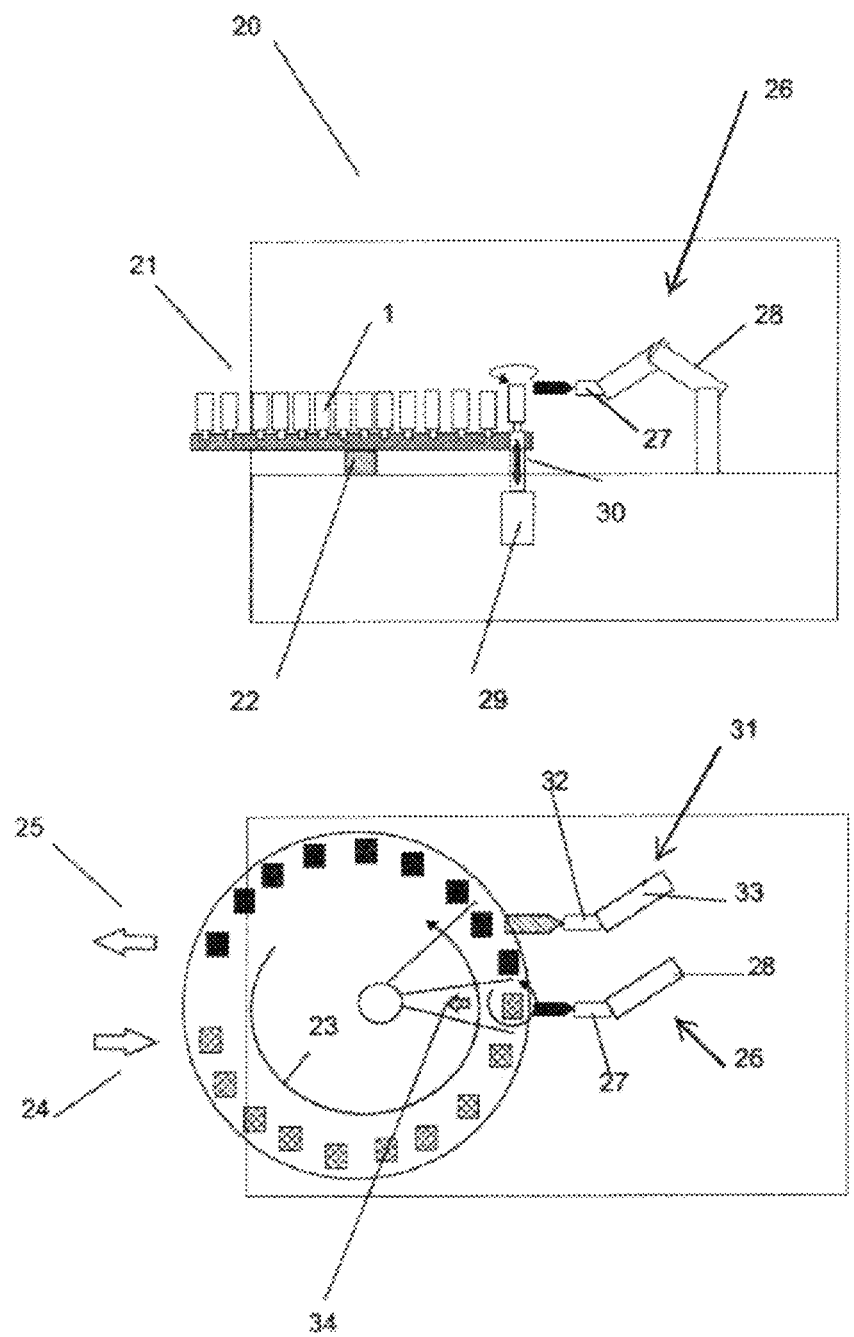
FIG. 5 shows a device for implementing the method of the invention, in side view and plan view.

FIG. 5 shows, diagrammatically, a device set up for implementing the method described above with reference to FIGS. 1-3:

The device (20) comprises a conveyor (21) in the form of a turntable, which is rotatable about an axis (22) of rotation counterclockwise in the direction of the conveying direction (23) shown in the plan view, by means of a motor drive. The drive allows the turntable to rotate, in particular cyclically, in the conveying direction (23).

The device (20) has a loading station (24) for placing the uncoated moldings (1), provided with the first and second regions, onto the conveyor (21), and also an unloading station (25) for taking the moldings (1), provided with a patterned coating, from the conveyor (21). Disposed in the conveying direction (23) between the loading station (24) and the unloading station (25) is a coating station (26), along the conveyed pathway of the as yet uncoated moldings (1). The coating station (26) has a plasma coating head as coating tool (27), and the coating tool (27) is disposed on a handling device (28). The handling device (28) may comprise, for example, an industrial robot which can be moved multiaxially and which generates a relative movement of the coating tool (27) to the surface to be coated on each molding (1).

If the molding (1), which is cuboidal in the exemplary embodiment, is to be given not only a coating on one side but instead a multisided coating, a further handling device (29) for each molding (1) may be disposed on the outer periphery of the turntable, with a holder (30) for the molding (1) being disposed on each handling device (29), and with the handling device (29) being set up for generating a rotary movement of the holder (30) about a vertical axis, parallel to the axis (22) of rotation of the turntable, and a vertical lifting movement in the direction of the axis (22) of rotation. Through rotation of the holder (30), the molding can be coated all round by means of the coating station (26). Furthermore, as a result of the lifting movement possible by means of the handling device (29), the plasma coating can be generated in sheet form, with the handling device moving the molding (1) in a vertical direction along the stationary plasma coating head.

As can be seen in particular from the plan view in FIG. 5, simultaneously during the coating of a molding (1) on the turntable, a molding (1) which has already moved on in the conveying direction (23) is supplied to a depletion station (31), which is disposed between the coating station (26) and the unloading station (25). The depletion station (31) has a depletion tool (32) in the form of a steel nozzle for solid carbon dioxide. The depletion tool is set up on a handling device (33) for generating a relative movement between the coating (4) on each molding (1) that is intended for partial removal, and the depletion tool (32). The handling device (33) of the depletion station (31), as well, may be implemented, for example, as a multiaxial industrial robot.

Through the inventive disposition of the coating station (26) and of the depletion station (31) along the conveyed pathway of the moldings (1) on the turntable, it is possible to carry out synchronous coating of a molding (1), cooling of a coated molding, and partial removal of the coating from a cooled, coated molding at the depletion station (31). Via a central suction withdrawal facility (34), which may be integrated into the axis (22) of rotation of the conveyor (21), excess coating material and excess material from the $CO_2$ snow jetting are drawn off centrally by suction and removed from the conveyor (21).

LIST OF REFERENCE SIGNS

| No. | Designation |
| --- | --- |
| 1. | Molding |
| 1a. | Blocks |
| 1b. | Coating |
| 2a, b, c. | First region |
| 2d. | Second region |
| 3. | Detail view |
| 4. | Coating |
| 5. | Jetting nozzle |
| 6. | Arrow |
| 7. | Line |
| 8. | Powder nozzle |
| 9. | Metall. coating material |
| 10. | Outlet |
| 11. | Gas mixture stream |
| 12. | Arrow |
| 13. | Laser |
| 14. | Laser beam |
| 20. | Device |
| 21. | Conveyor |
| 22. | Axis of rotation |
| 23. | Conveying direction |
| 24. | Loading station |
| 25. | Unloading station |
| 26. | Coating station |
| 27. | Coating tool |
| 28. | Handling device |
| 29. | Handling device |
| 30. | Holder |
| 31. | Depletion station |
| 32. | Depletion tool |
| 33. | Handling device |
| 34a, b. | Suction withdrawal facilities |

The invention claimed is:

1. A method for producing metallic patterned coatings on a molding, comprising the steps of:
   providing a molding consisting of plastic capable of forming a three-dimensional circuit carrier, the molding having a plastic surface with a first region and a second region, wherein the first region of the plastic surface of the molding is patterned by a laser to generate a difference in at least one surface property between the first region and the second region,
   applying a metallic coating directly to the plastic surface so that the metallic coating covers at least the first region and the second region, an adherence of the metallic coating in the first region being higher than in the second region because of the difference in the at least one plastic surface property, the adherence of the coating in the first region being greater than 100 $N/cm^2$ up to a maximum of 500 $N/cm^2$ and the adherence of the coating in the second region of the plastic surface being less than 10 N/cm², wherein the step of applying the metallic coating includes applying metal powder by a plasma coating method or a laser coating method to the surface of the molding and the metal powder is applied so that the applied metallic coating has a porosity of at least 3%, partially removing the metallic coating by $CO_2$ snow jetting as a depletion method, wherein the step of partially removing is performed with a constant depletion rate which is determined such that the metallic coating in the second region is removed completely and the metallic coating in the first region is retained over a full area of the first region.

2. The method as claimed in claim 1, wherein the at least one plastic surface property of the first and second regions includes at least one of roughness, hardness, surface tension, and structure of material.

3. The method as claimed in claim 1, wherein the difference in the at least one surface property between the first region and the second region is configured such that the adherence of the metallic coating in the first region is higher by at least 5% than the adherence of the metallic coating in the second region.

4. The method as claimed in claim 1, wherein the difference in the at least one surface property between the first region and the second region is configured such that the adherence of the metallic coating in the first region is higher by at least 50% than the adherence of the metallic coating in the second region.

5. The method as claimed in claim 1, wherein the adherence of the metallic coating is determined by a frontal pull-off test according to DIN EN ISO 4624:2003.

* * * * *